United States Patent
Pant et al.

(10) Patent No.: US 10,811,882 B2
(45) Date of Patent: Oct. 20, 2020

(54) SOLAR INVERTER GRID EMULATION MODE

(71) Applicant: GE Energy Power Conversion Technology Ltd, Warwickshire (GB)

(72) Inventors: Siddharth Pant, Pittsburgh, PA (US); Philip EdgarCrapse Stone, Pittsburgh, PA (US); Bacil Shaqqo, Pittsburgh, PA (US); Rajesh Bhupathi, Pittsburgh, PA (US); Shrutish Dawande, Pittsburgh, PA (US)

(73) Assignee: GE ENERGY POWER CONVERSION TECHNOLOGY LTD, Warwickshire (GB)

( * ) Notice: Subject to any disclaimer, the term of this patent is extended or adjusted under 35 U.S.C. 154(b) by 311 days.

(21) Appl. No.: 15/290,753

(22) Filed: Oct. 11, 2016

(65) Prior Publication Data

US 2018/0102651 A1 Apr. 12, 2018

Related U.S. Application Data

(60) Provisional application No. 62/341,682, filed on May 26, 2016.

(51) Int. Cl.
*H02J 3/38* (2006.01)
*H02M 1/44* (2007.01)
*H02M 7/44* (2006.01)
*H02S 40/32* (2014.01)
*H02S 50/10* (2014.01)

(52) U.S. Cl.
CPC .............. *H02J 3/383* (2013.01); *H02M 1/44* (2013.01); *H02M 7/44* (2013.01); *H02S 50/10* (2014.12); *Y02E 10/563* (2013.01)

(58) Field of Classification Search
CPC . H02J 3/383; H02M 1/44; H02M 7/44; H02S 40/32; H02S 50/10
See application file for complete search history.

(56) References Cited

U.S. PATENT DOCUMENTS

| | | | |
|---|---|---|---|
| 2013/0107587 A1 | 5/2013 | Xu et al. | |
| 2014/0015555 A1 | 1/2014 | Fox et al. | |
| 2014/0197843 A1 | 7/2014 | Schurman et al. | |
| 2016/0218513 A1* | 7/2016 | Myller | H02J 3/383 |

FOREIGN PATENT DOCUMENTS

| | | |
|---|---|---|
| CN | 2016099430 U | 1/2011 |
| EP | 2 458 394 A2 | 5/2012 |
| GB | 200714851 A | 4/2009 |

OTHER PUBLICATIONS

Extended European Search Report and Opinion issued in connection with corresponding EP Application No. 17172926.2 dated Nov. 7, 2017.

* cited by examiner

*Primary Examiner* — Rexford N Barnie
*Assistant Examiner* — Thai H Tran
(74) *Attorney, Agent, or Firm* — Wood IP LLC

(57) ABSTRACT

A method, apparatus, and system to control and test a solar inverter are provided. The method commissions a solar inverter of a solar plant before it is placed into power production. The commissioning process verifies that the inverter to be tested is functioning as intended by connecting a first inverter to the inverter to be commissioned, and using the first inverter to emulate the power grid without being connected to the power grid, and circulate reactive and limited active power between the first inverter and the inverter to be commissioned.

11 Claims, 4 Drawing Sheets

SOLAR INVERTER GRID EMULATION MODE

TECHNICAL FIELD

Embodiments relate to a method, apparatus, and system to control and test a solar inverter. The method commissions a solar inverter of a solar plant before it is placed into power production. The commissioning process verifies that the inverter to be tested is functioning as intended by connecting a first inverter to the inverter to be commissioned, and using the first inverter to emulate the power grid without being connected to the power grid, and circulate reactive and limited active power between the first inverter (or, the emulated power grid) and the inverter to be commissioned.

BACKGROUND

In solar plant power systems, solar inverters are commissioned on site before they are allowed to go into power production. The commissioning process verifies that the inverter is functioning as intended. Photovoltaic (PV) panels may be connected to the inverter to be commissioned, and basic status checks may be carried out. This phase of testing the inverter is considered pre-commissioning, because there is no current flow. True commissioning begins when the utility provides back feed, that is, voltage is provided at the point of interconnection (POI), and allows alternating current (AC) power to flow to and from the power grid.

At this point, approximately eight to sixteen hours of commissioning is required to fully commission a large multi-megawatt inverter. If a malfunction is detected, the commissioning time may increase substantially. This results in a loss of generating power and revenue, since the inverter is not producing power during the commissioning stage. For an entire solar plant, this translates to a significant loss of revenue.

DRAWINGS

The various advantages of the embodiments will become apparent to one skilled in the art by reading the following specification and appended claims, and by referencing the following drawings, in which:

DESCRIPTION OF EMBODIMENTS

In accordance with embodiments, a method, apparatus, and system are provided to prepare and carry out grid emulation by using a designated solar inverter as an emulator or emulating inverter to carry out basic grid emulation. According to an embodiment, the emulating inverter may be an LV5-1540-SLR solar inverter. However, this solar inverter is only exemplary. Basic grid emulation provides a manner of operating multi-megawatt inverters in a configuration as close to normal operation as possible without the availability of grid back-feed.

The basic grid emulation functionality may assist in the initial commissioning of inverters. One inverter may be set up to be a grid emulator or emulating inverter, and may provide, as an example, a 550 Vac 60 Hz 3-phase voltage, and another inverter may act as a producer or consumer of reactive power.

In accordance with embodiments, external load banks may not be required to test or commission the inverters.

Figure 1:
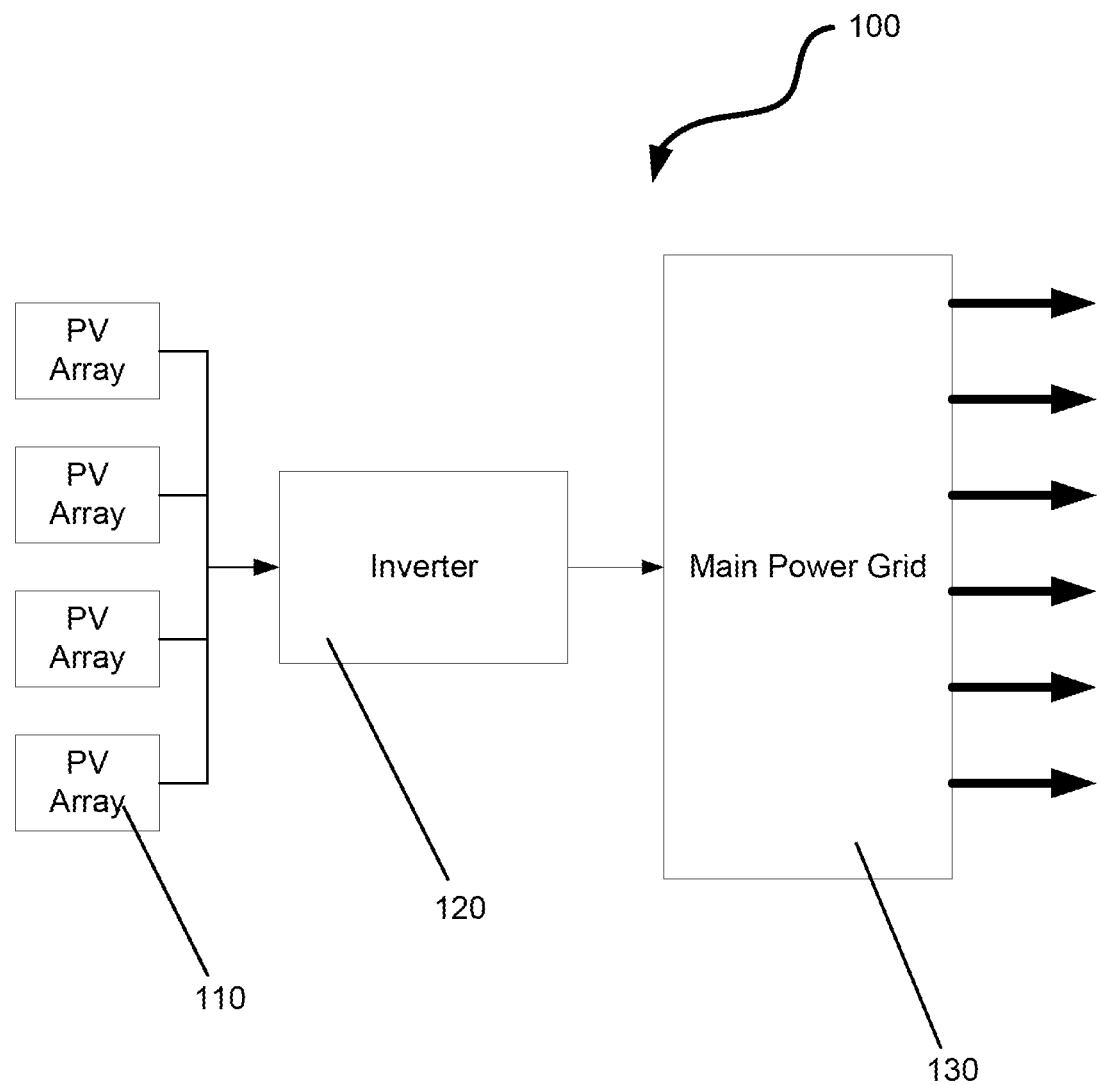
FIG. 1 illustrates a solar power system, in accordance with embodiments.

FIG. 1 illustrates a solar power plant system 100 in accordance with embodiments. The illustrated solar power plant system 100 includes one or more photovoltaic (PV) arrays 110 which convert sunlight into electrical energy. The PV arrays 110 may be installed, for example, in residential or commercial rooftops, or alternately, in ground mounted solar farms. The PV arrays 110 produce direct current (DC), the intensity of which may fluctuate based on the level of sunlight to which the panels of the PV arrays 110 are exposed. The DC current that is produced by the PV arrays 110 is to be transmitted to an inverter 120, which converts the received DC current to alternating current (AC) at desired phases and frequencies, which is required for practical applications. The converted AC current may then be transmitted to a power grid 130, which shares the AC current with applications and entities such as residential and commercial buildings.

Figure 2:
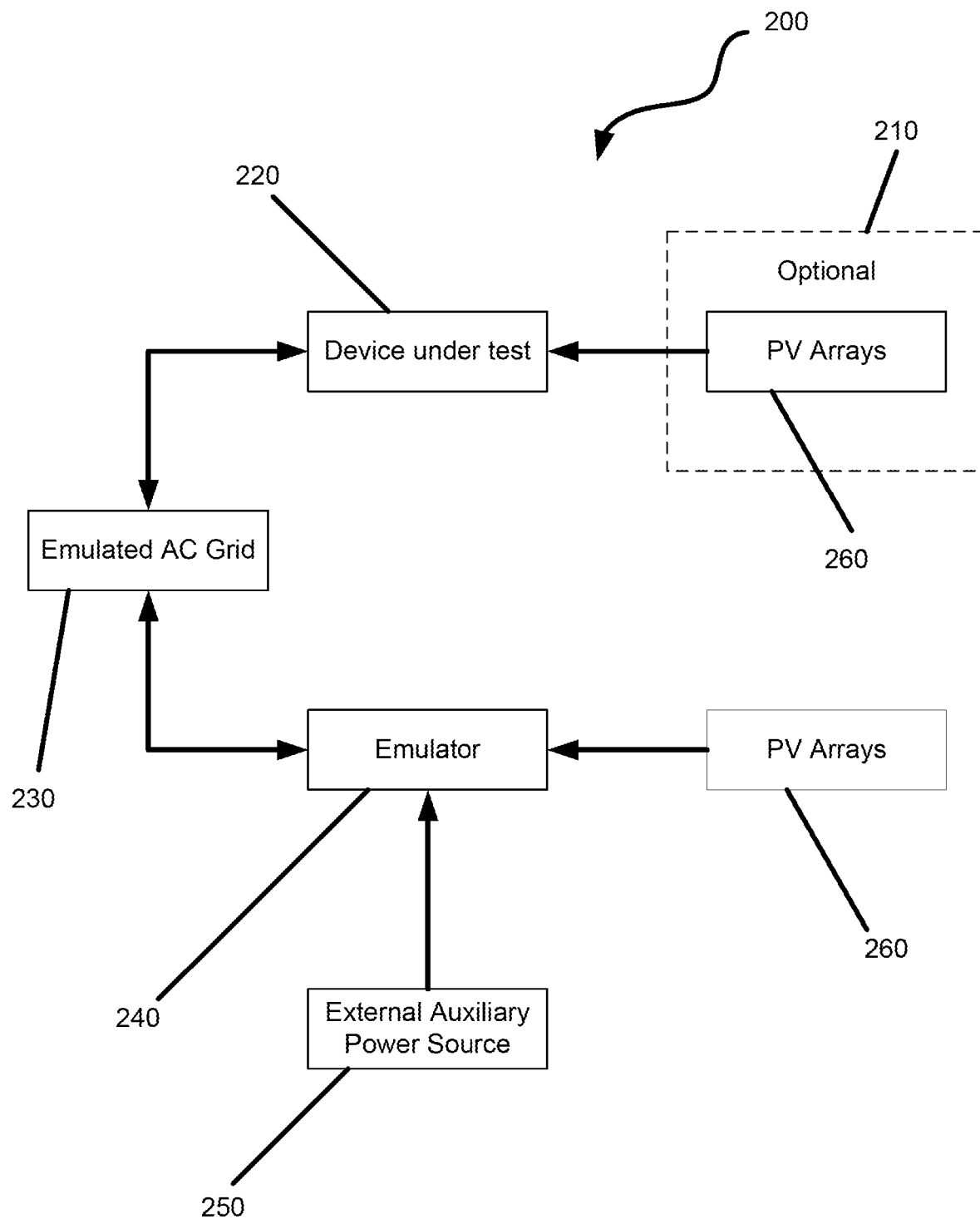
FIG. 2 illustrates a grid emulation system, in accordance with embodiments.

FIG. 2 illustrates a solar grid emulation system 200, in accordance with embodiments. The solar grid emulation system 200 includes a grid-emulating inverter or emulator 240 which circulates reactive and limited active power between it and an inverter 220 to be commissioned, which is the device under test. The reactive power supplied or consumed by the inverters may be limited by the stability of the emulated grid 230.

The operative connection of the emulating inverter 240 to the inverter 220 to be commissioned allows testing of the inverter 220 to be conducted prior to the availability of the power grid 130 (FIG. 1), or prior to connection of the inverter 220 to the power grid 130 (FIG. 1). Accordingly, a power grid or a load bank is not needed for the commissioning process of the inverter 220 to take place. Commissioning of the inverter 220 by the emulating inverter 240 also allows the inverter 220 to be tested at full voltage and current, and accordingly, in a configuration as close to normal operation as possible, without the availability of grid back-feed.

To complete the commissioning process, the emulating inverter 240 may establish a voltage to which the inverter 220 synchronizes. The inverter 220 may then begin to generate active and reactive power. The generation of reactive power by the inverter 220 may be achieved with or without connection to the PV array 260.

In accordance with embodiments, the emulating inverter 240 may, for example, be an inverter. Such an inverter may be a solar inverter such as, for example, an LVR-1540-SLR solar inverter. Embodiments, however, are not limited thereto and may encompass other types of emulating inverters that will fall within the spirit and scope of the principles of this disclosure.

In addition to receiving power from a DC power source, for example, PV array 260, the grid emulating inverter 240 may receive auxiliary control power from an external auxiliary power source 250. The inverter 220 to be tested may also receive power from a DC power source, for example, PV array 260, but may not require control power from an external power source.

Additionally, the functionalities of the grid emulating inverter 240 and the inverter 220 to be commissioned may be controlled, for example, by a control system. Such a control system may, for example, comprise a Supervisory Control and Data Acquisition (SCADA) system. The SCADA control system is a system that remotely monitors and controls remote equipment, and may be combined with a data acquisition system by adding the use of coded signals over communication channels to acquire information about the status of the remote equipment for display or for recording functions.

Although FIG. 2 illustrates a single inverter 220 as being commissioned, this is only exemplary, and two or more inverters may be connected to the single emulating inverter 240, in accordance with embodiments.

Figure 3:
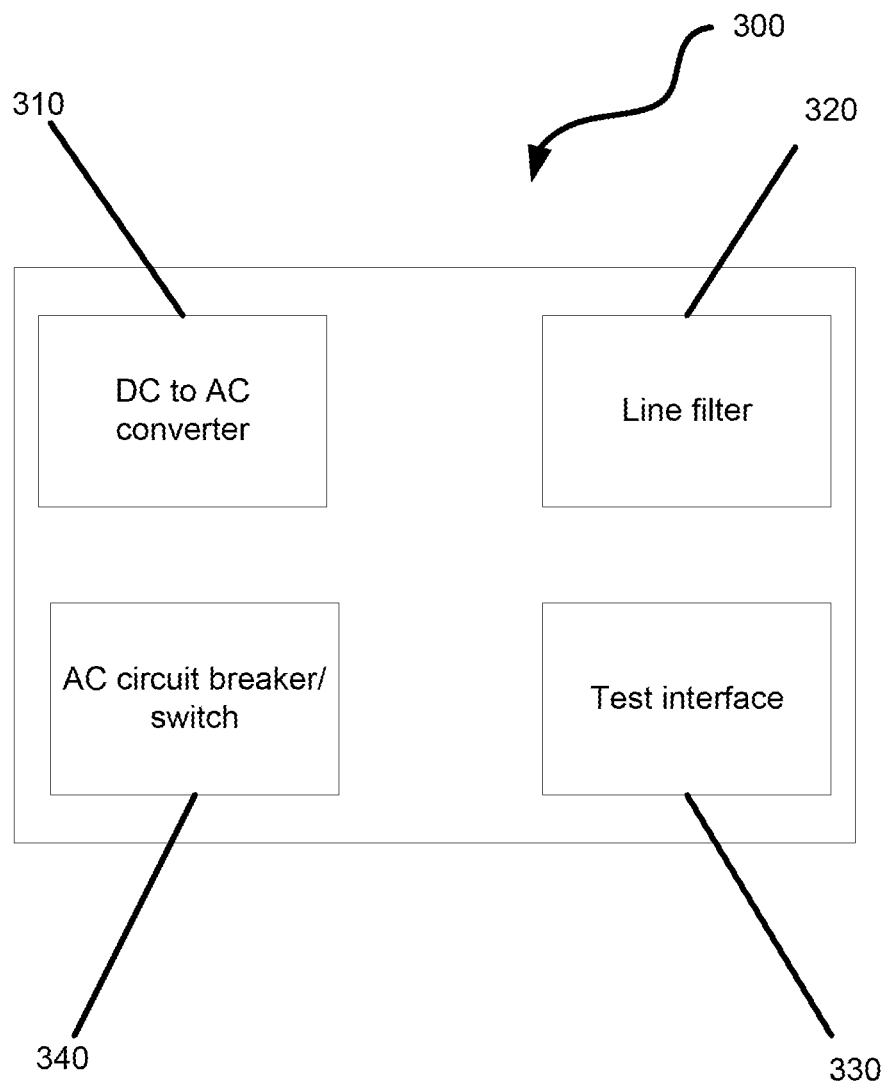
FIG. 3 illustrates a grid emulating inverter, in accordance with embodiments.

FIG. 3 illustrates a diagram of an emulating inverter or emulator 300, in accordance with embodiments. The emulating inverter 300 may include, for example, a DC-to-AC converter 310. The DC-to-AC converter 310 is to convert the variable DC output of PV solar arrays 110 (FIG. 1) into an AC current that may be fed into a power grid 130 (FIG. 1), or alternately, may be used by an off-grid electrical network.

In order to address interference issues caused by the DC to AC conversion process, one or more line filters 320 may be used. The line filters 320 may include, but are not limited to, DC electromagnetic compatibility (EMC) filters, AC EMC filters, and sine wave filters. Embodiments, however, are not limited thereto and may encompass other types of filters that will fall within the spirit and scope of the principles of this disclosure.

A test interface 330 is to connect the emulating inverter/ solar inverter 300, as an auxiliary (or first) inverter, to at least one primary (or second) solar inverter to be commissioned. An AC circuit breaker or switch 340 is to allow operative connection and disconnection of the emulating inverter 330 from the at least one primary solar inverter to be commissioned. The AC circuit breaker 340 may also control the disconnection and lock-out of the power grid 130 (FIG. 1) during the commissioning process.

Figure 4:
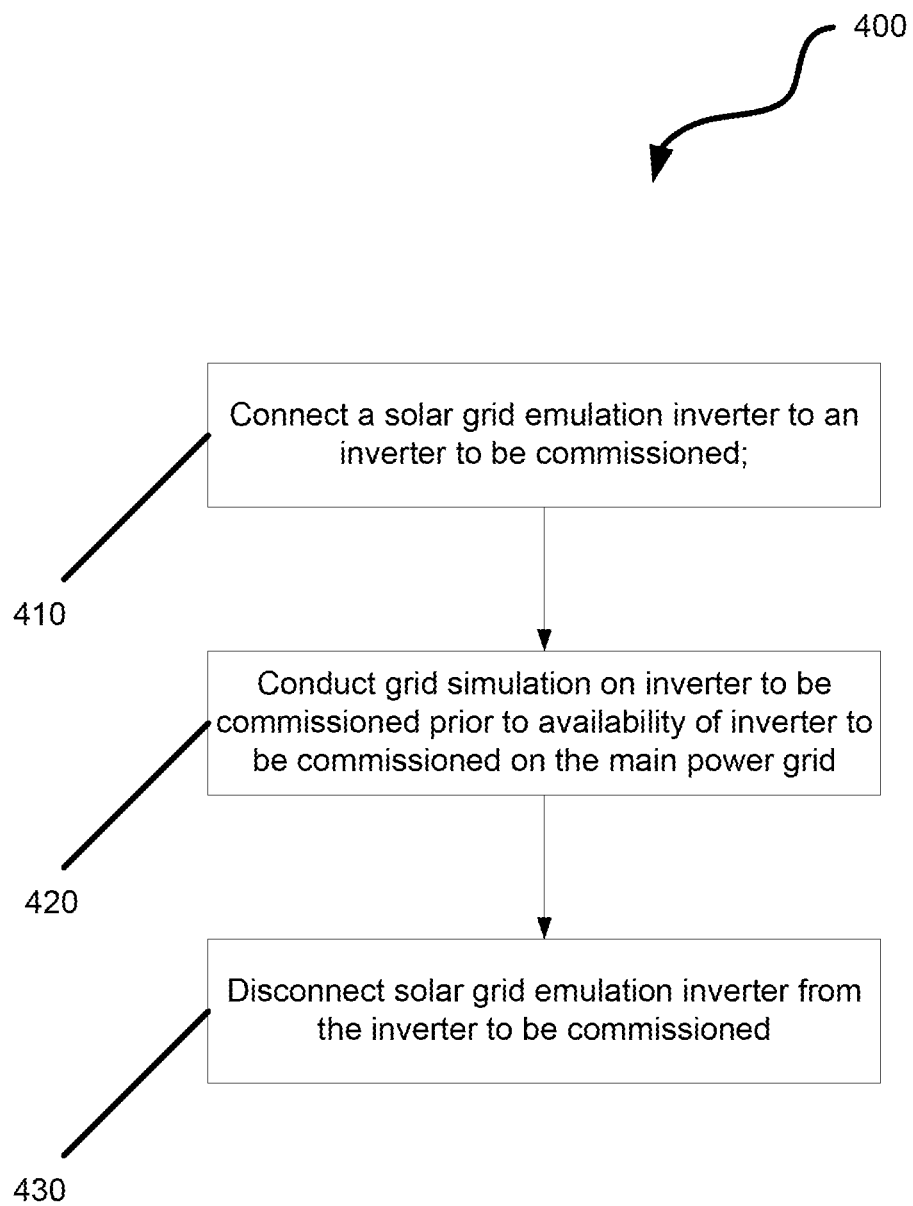
FIG. 4 illustrates a flow chart of a method of commissioning an inverter, in accordance with embodiments.

FIG. 4 illustrates a method 400 of controlling a solar grid emulation system, in accordance with embodiments. The method 400 may be implemented as a set of logic and/or firmware instructions stored in a machine- or computer-readable storage medium such as random access memory (RAM), read only memory (ROM), programmable ROM (PROM), flash memory, etc., in configurable logic such as, for example, programmable logic arrays (PLAs), field programmable gate arrays (FPGAs), complex programmable logic devices (CPLDs), in fixed functionality logic hardware using circuit technology such as, for example, application specific integrated circuit (ASIC), complementary metal oxide semiconductor (CMOS) or transistor-transistor logic (TTL) technology, or any combination thereof. For example, computer program code to carry out operations shown in the method 400 may be written in any combination of one or more programming languages, including an object oriented programming language such as Java, Smalltalk, C++ or the like and conventional procedural programming languages, such as the "C" programming language or similar programming languages.

Illustrated processing block 410 involves connecting a solar grid emulation inverter 240 (FIG. 2), as an auxiliary inverter, to one or more primary inverters 220 (FIG. 2) to be commissioned. The commissioning process, for example, may be carried out without the availability of the power grid.

Illustrated processing block 420 involves conducting, via the grid emulation inverter 240 (FIG. 2), a grid simulation on at least one primary solar inverter to be commissioned 220 (FIG. 2), prior to an availability of the at least one second solar inverter (220 (FIG. 2) to be commissioned on the power grid 130 (FIG. 1).

Illustrated processing block 430 involves disconnecting the grid emulation inverter 240 (FIG. 2) from the at least one primary solar inverter 220 (FIG. 2) to be commissioned.

The method, apparatus, and system in accordance with embodiments allows for the commissioning of inverters to be completed before the inverter to be tested is connected to a power grid. This avoids the use of a costly load bank, and also avoids waiting for the grid connection to be established, and thus saves time and money.

ADDITIONAL NOTES AND EXAMPLES

Example One may include a solar power grid emulating inverter, comprising: a first solar inverter to provide grid simulation to at least one second solar inverter to be commissioned for use on a power grid; an interface to operatively connect the first solar inverter to the at least one second solar inverter to be commissioned; and a switch to disconnect the first solar inverter from the at least one second solar inverter to be commissioned.

Example Two may include solar power grid emulating inverter of Example 1, wherein the first solar inverter is configured to receive power from at least one photovoltaic (PV) array.

Example Three may include the solar power grid emulating inverter of Example 1, wherein the first solar inverter is configured to receive power from an external auxiliary power source.

Example 4 may include the solar power grid emulating inverter of Example 1, further comprising an AC circuit breaker to operatively disconnect the first solar inverter from the at least one second solar inverter to be commissioned.

Example 5 may include the solar power grid emulating inverter of Example 1, wherein the first solar inverter is configured to supply reactive and active power to the at least one second solar inverter to be commissioned.

Example 6 may include solar power grid emulating inverter of Example 1, wherein the first solar inverter and the at least one second solar inverter are operatively connected to a Supervisory Control and Data Acquisition (SCADA) system.

Example 7 may include solar power grid emulating inverter of Example 1, further comprising a direct current (DC) to alternating current (AC) converter, and a line filter.

Example 8 may include a method for commissioning an inverter, the method comprising: operatively connecting a first solar inverter to at least one second solar inverter to be commissioned for use on a main power grid; conducting, via the first solar inverter, a grid simulation on the at least one second solar inverter to be commissioned, prior to an availability of the at least one second solar inverter to be commissioned on the main power grid; and operatively disconnecting the first solar inverter from the at least one second solar inverter to be commissioned.

Example 9 may include the method of Example 8, further comprising powering the first solar inverter via at least one photovoltaic (PV) array.

Example 10 may include the method of Example 8, further comprising powering the first solar inverter via an external auxiliary power source.

Example 11 may include the method of Example 8, wherein disconnecting the first solar inverter comprises disconnecting the first solar inverter from the at least one second solar inverter to be commissioned via an alternating current (AC) circuit breaker.

Example 12 may include the method of Example 8, wherein conducting, via the first solar inverter, the grid simulation comprises supplying reactive and active power to the at least one second solar inverter to be commissioned.

Example 13 may include the method of claim 8, further comprising controlling the first solar inverter and the at least one second solar inverter via a Supervisory Control and Data Acquisition (SCADA) system.

Example 14 may include a system, comprising: a first solar inverter; a main power grid having a plurality of second solar inverters, wherein the first solar inverter is configured to provide grid simulation to at least one of the second solar inverters to be commissioned for use on the main power grid, the first solar inverter including: a test interface to connect the first solar inverter to the at least one second solar inverter to be commissioned; and a switch to operatively disconnect the first solar inverter from the at least one second solar inverter to be commissioned.

Example 15 may include the system of Example 14, further comprising at least one photovoltaic (PV) array to provide power to the first solar inverter.

Example 16 may include the system of Example 14, further comprising an external auxiliary power source to provide power to the first solar inverter.

Example 17 may include the system of Example 14, further comprising an AC circuit breaker to operatively disconnect the first solar inverter from the at least one second solar inverter to be commissioned.

Example 18 may include the system of Example 14, wherein the first solar inverter is configured to supply reactive and active power to the at least one second solar inverter to be commissioned.

Example 19 may include the system of Example 14, further comprising a Supervisory Control and Data Acquisition (SCADA) system to control the first solar inverter or the at least one second solar inverter.

Example 20 may include the system of Example 14, wherein the first solar inverter further comprises a direct current (DC) to alternating current (AC) converter and a line filter.

The term "coupled" or "connected" may be used herein to refer to any type of relationship, direct or indirect, between the components in question, and may apply to electrical, mechanical, fluid, optical, electromagnetic, electromechanical or other connections. In addition, the terms "first," "second, etc. are used herein only to facilitate discussion, and carry no particular temporal or chronological significance unless otherwise indicated.

This written description uses examples to disclose the invention, including the preferred embodiments, and also to enable any person skilled in the art to practice the invention, including making and using any devices or systems and performing any incorporated methods. The patentable scope of embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, may be mixed and matched by one of ordinary skill in the art to construct additional embodiments and techniques in accordance with principles of this application.

What is claimed is:

1. A solar power grid emulating inverter, comprising:
    a first solar inverter to provide grid simulation to at least one second solar inverter to be commissioned for use on a power grid, prior to connection of the at least one second solar inverter to the power grid, wherein (i) the first solar inverter being coupled to and receiving power from at least one photovoltaic (PV) array, (ii) the first solar inverter being coupled to and receiving power from an external auxiliary power source (iii) the first solar inverter being coupled directly to an emulated AC grid which is connected between the at least one second solar inverter and the first solar inverter, and (iv) the first solar inverter is configured to establish a voltage to which the at least one second solar inverter is to be synchronized;
    the first solar inverter comprising:
        an interface to directly couple the first solar inverter to the emulated AC grid and to operatively connect the first solar inverter to the at least one second solar inverter to be commissioned, wherein the first solar inverter circulates reactive power and active power between the first solar inverter and the at least one second solar inverter to be commissioned; and
        a switch to disconnect the first solar inverter from the at least one second solar inverter to be commissioned,
    wherein the at least one second solar inverter is capable of generating reactive power without connection to a PV array.

2. The solar power grid emulating inverter of claim 1, wherein the switch comprises an AC circuit breaker to operatively disconnect the first solar inverter from the at least one second solar inverter to be commissioned.

3. The solar power grid emulating inverter of claim 1, wherein the first solar inverter and the at least one second solar inverter are operatively connected to a Supervisory Control and Data Acquisition (SCADA) system.

4. The solar power grid emulating inverter of claim 1, wherein the first solar inverter comprises a direct current (DC) to alternating current (AC) converter, and a line filter.

5. A method for commissioning an inverter, the method comprising:
    operatively connecting a first solar inverter to at least one second solar inverter to be commissioned for use on a main power grid, the first solar inverter being powered by at least one photovoltaic (PV) array and being powered by an external auxiliary power source and being coupled directly to an emulated AC grid which is connected between the at least one second solar inverter and the first solar inverter;
    conducting, via the first solar inverter, a grid simulation on the at least one second solar inverter to be commissioned on the main power grid, prior to connection of the at least one second solar inverter to the main power grid by establishing, via the first solar inverter, a voltage to which the at least one second solar inverter is be synchronized, wherein the first solar inverter circulates reactive power and active power between the first solar inverter and the at least one second solar inverter to be commissioned;
    operatively disconnecting the first solar inverter from the at least one second solar inverter to be commissioned;

generating, via the at least one second solar inverter, reactive power without connection to a PV array.

6. The method of claim 5, wherein disconnecting the first solar inverter comprises disconnecting the first solar inverter from the at least one second solar inverter to be commissioned via an alternating current (AC) circuit breaker.

7. The method of claim 5, further comprising controlling the first solar inverter and the at least one second solar inverter via a Supervisory Control and Data Acquisition (SCADA) system.

8. A solar grid emulation system, comprising:
   a first solar inverter powered by at least one photovoltaic (PV) array and powered by an external auxiliary power source;
   a plurality of second solar inverters to be commissioned for use on a main power grid;
   an emulated AC grid wherein the first solar inverter is configured to provide grid simulation to at least one of the second solar inverters to be commissioned for use on a main power grid, prior to connection to the main power grid of the at least one second solar inverter to be commissioned,
   wherein the first solar inverter is coupled directly to the emulated AC grid which is connected between the first solar inverter and the at least one of the second solar inverters and is configured to establish a voltage to which the at least one of the second solar inverters is to be synchronized, the first solar inverter including:
      a test interface to directly couple the first solar inverter to the emulated AC grid and to operatively connect the first solar inverter to the at least one second solar inverter to be commissioned, wherein the first solar inverter circulates reactive power and active power between the first solar inverter and the second solar inverter to be commissioned; and
      a switch to operatively disconnect the first solar inverter from the at least one second solar inverter to be commissioned,
   wherein the at one second solar inverter is capable of generating reactive power without connection to a PV array.

9. The system of claim 8, wherein the switch comprises an AC circuit breaker to operatively disconnect the first solar inverter from the at least one second solar inverter to be commissioned.

10. The system of claim 8, further comprising a Supervisory Control and Data Acquisition (SCADA) system to control the first solar inverter or the at least one second solar inverter.

11. The system of claim 8, wherein the first solar inverter further comprises a direct current (DC) to alternating current (AC) converter and a line filter.

* * * * *